(12) United States Patent
Rovere et al.

(10) Patent No.: US 9,622,356 B2
(45) Date of Patent: Apr. 11, 2017

(54) ELECTRONIC PACKAGE MOUNTING

(71) Applicant: Lockheed Martin Corporation, Bethesda, MD (US)

(72) Inventors: Tom Rovere, Binghamton, NY (US); James K. Lake, Endicott, NY (US); Rick Micha, Johnson City, NY (US); Paul Coyne, Endicott, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 416 days.

(21) Appl. No.: 13/943,833

(22) Filed: Jul. 17, 2013

(65) Prior Publication Data

US 2014/0268605 A1    Sep. 18, 2014

Related U.S. Application Data

(60) Provisional application No. 61/783,995, filed on Mar. 14, 2013.

(51) Int. Cl.
*H05K 9/00* (2006.01)
*H05K 3/30* (2006.01)
*H05K 3/34* (2006.01)

(52) U.S. Cl.
CPC .......... *H05K 3/301* (2013.01); *H05K 3/3436* (2013.01); *H05K 2201/2018* (2013.01); *H05K 2201/2036* (2013.01); *H05K 2203/1147* (2013.01); *Y10T 29/4913* (2015.01)

(58) Field of Classification Search
CPC ...... H01L 21/563; H05K 3/3442; H05K 9/00; H05K 9/0016; H05K 9/0062; G06F 1/182
USPC .................. 361/816, 818; 174/520–524
See application file for complete search history.

(56) References Cited

U.S. PATENT DOCUMENTS

| | | | | |
|---|---|---|---|---|
| 5,289,346 | A  * | 2/1994  | Carey et al. .................. | 361/777 |
| 5,336,931 | A  * | 8/1994  | Juskey et al. ................. | 257/787 |
| 5,385,869 | A  * | 1/1995  | Liu et al. ......................... | 29/841 |
| 5,448,114 | A    | 9/1995  | Kondoh et al. | |
| 5,936,846 | A  * | 8/1999  | Jairazbhoy ........... | H05K 3/3442 174/138 G |
| 6,117,797 | A  * | 9/2000  | Hembree ...................... | 438/759 |
| 6,359,335 | B1 * | 3/2002  | Distefano et al. ............ | 257/707 |
| 6,459,164 | B2 * | 10/2002 | Nagerl et al. ................. | 257/795 |
| 6,562,663 | B2   | 5/2003  | Scheifers et al. | |
| 7,239,023 | B2   | 7/2007  | Yu-Tung et al. | |
| 2007/0035021 | A1 * | 2/2007 | Suzuki .................. | H01L 21/563 257/737 |

* cited by examiner

*Primary Examiner* — Tuan T Dinh
(74) *Attorney, Agent, or Firm* — Reising Ethington P.C.

(57) ABSTRACT

An assembly and method for mounting an electronic package to a printed circuit board (PCB) in which a gasket is shaped to fit tightly around and under a perimeter edge of an electronic package. The electronic package may be carried by the PCB and comprise electrical package contacts on an underside of the package, which contact PCB contacts on the PCB. The gasket may be disposed between the underside of the package and the PCB substrate and surround the contacts, and may be shaped to fit around and under a perimeter edge of the package to protect the contacts from contamination.

5 Claims, 2 Drawing Sheets

ELECTRONIC PACKAGE MOUNTING

CROSS-REFERENCE TO RELATED APPLICATION

This application claims the benefit of U.S. Provisional Application No. 61/783,995, filed Mar. 14, 2013, the content of which is incorporated herein by reference in its entirety.

BACKGROUND

Field

This application relates generally to the mounting of electronic packages to printed circuit boards.

Description of Related Art Including Information Disclosed Under 37 CFR 1.97 and 1.98

Electronic packages are commonly sealed to a printed circuit board (PCB) via Uralane® or similar adhesive substances. This sealing process is intended to allow a package to be mated to a PCB in such a way as to prevent foreign objects from contaminating a contact area between the PCB and the package. However, when applied, the uncured sealant itself can foul the contact area, requiring cleaning of the package and re-accomplishment of the entire sealing process.

SUMMARY

An electronic package mounting assembly may comprise a printed circuit board assembly (PCBA) including a printed circuit board (PCB) comprising conductive pathways carried by a non-conductive substrate, and further including electrical PCB contacts carried by the PCB substrate and coupled with the conductive pathways. An electronic package may be carried by the PCB and may include electrical package contacts on an underside of the package. The package contacts may be in contact with the PCB contacts. A gasket may be disposed between the underside of the package and the PCB substrate. The gasket may surround the contacts, and may be shaped to fit around and under a perimeter edge of the package.

Also provided is a gasket for supporting an electronic package on a PCB substrate. The gasket may be shaped to fit around and under a perimeter edge of an electronic package and to rest flat on a PCB substrate.

Also provided is a method for mounting an electronic package on a PCB substrate is also provided. The method may comprise the steps of fabricating a gasket in a shape that fits circumferentially around and under a perimeter edge of an electronic package, and mounting the gasket on the package such that a lip of the gasket extends inwardly under the package and surrounds package contacts. The method may also include the step of supporting the gasket and package on a PCB substrate such that the gasket lip is sandwiched between the PCB substrate and an outer marginal portion of a bottom surface of the package and such that the package contacts are in contact with PCB contacts.

DRAWING DESCRIPTIONS

DETAILED DESCRIPTION

Figure 1:
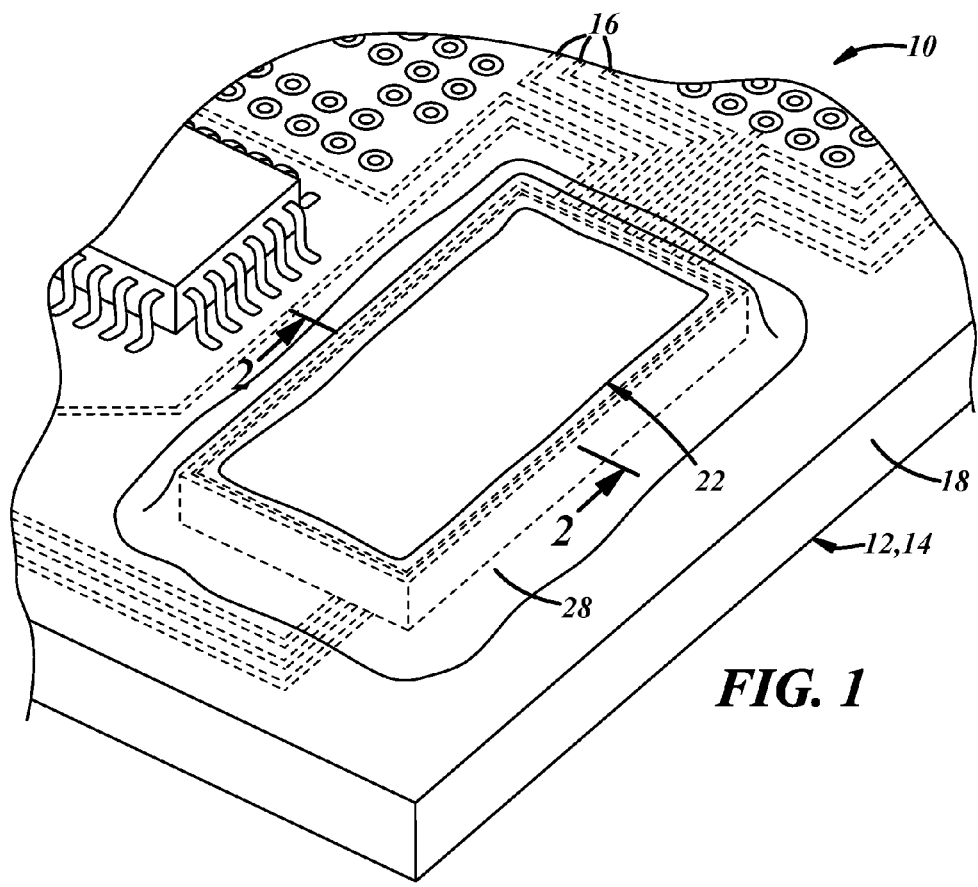
FIG. 1 is a fragmentary orthogonal view of an electronic package mounting assembly.
Figure 3:
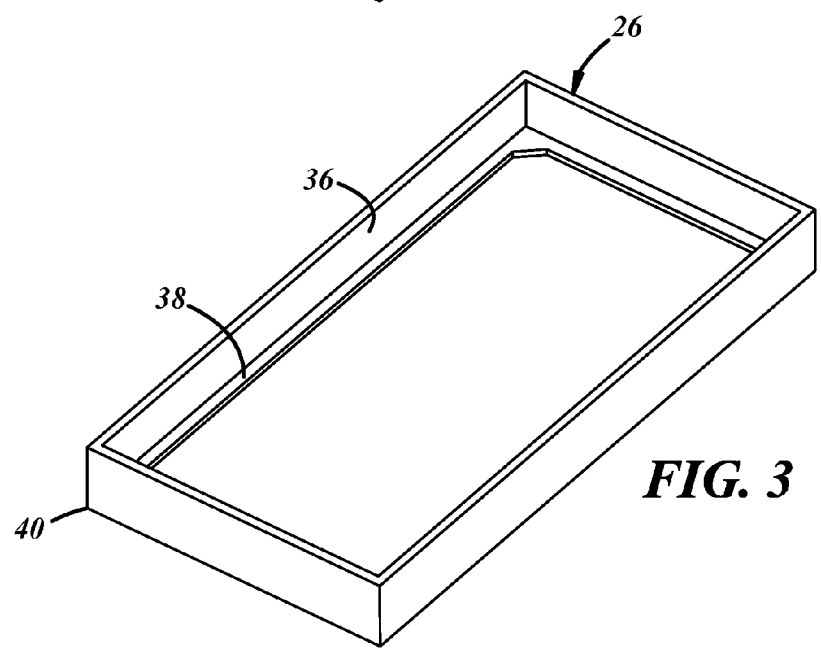
FIG. 3 is an orthogonal view of a gasket element of the electronic package mounting assembly of FIGS. 1 and 2.
Figure 2:
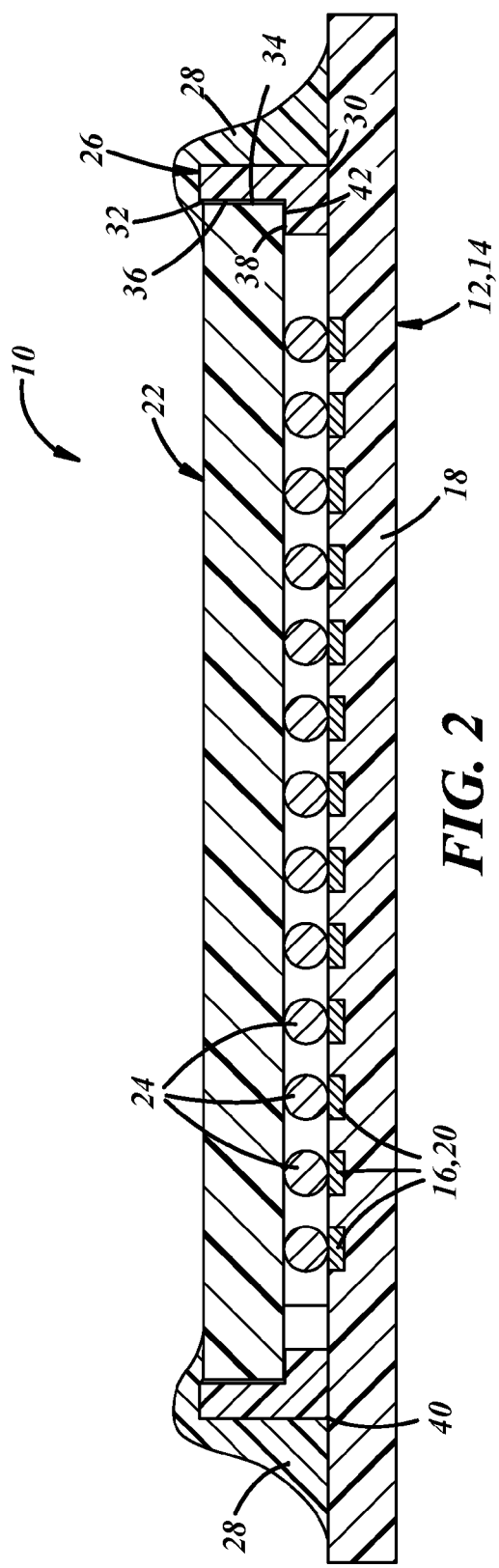
FIG. 2 is a cross-sectional front view of the mounting assembly of FIG. 1 taken along line 2-2 of FIG. 1.

An assembly for mounting a surface-mount electronic package on a printed circuit board (PCB) substrate is generally shown at 10 in FIGS. 1-3. The assembly 10 may include a printed circuit board assembly 12 (PCBA), which may include a printed circuit board 14 that may comprise conductive pathways 16 carried by a substrate 18 which may comprise non-conductive material as shown in FIG. 1. The conductive pathways 16 may, for example, be conductive tracks and/or signal traces etched from sheets of conductive material such as copper laminated onto or otherwise carried by the substrate 18. As best shown in FIG. 2, the PCB 14 may further comprise electrical PCB contacts 20 carried by the PCB substrate 18 and coupled with the conductive pathways 16. The assembly 10 may also include an electronic package 22 carried by the PCB 14 and comprising electrical package contacts 24, such as the ball contacts of a ball grid array (BGA), which may be mounted on an underside of the package 22 such that they may be aligned and in contact with selected ones of the PCB contacts 20. Accordingly, the electronic package 22 may be a surface mount type of electronic package.

As shown in FIG. 2, the assembly 10 may also include a perimeter gasket 26, at least a portion of which may be disposed between the underside of the package 22 and the PCB substrate 18 and surrounding the contacts 20, 24 to protect the contacts 20, 24 from contamination. The gasket 26 may be generally rectangular as in the illustrated example, or any other suitable shape corresponding to and complementing the outer profile of the package 22. A layer of adhesive material 28 may surround the gasket 26, and may coat a lower interface 30 between the gasket 26 and the PCB substrate 18 and/or an upper interface 32 between the gasket 26 and the package 22 to secure the package 22 to the PCB substrate 18. The gasket 26 may be shaped to fit around and under a laterally outer perimeter edge 34 of the package 22, to positively position the package 22 relative to the PCB substrate 18, to keep the package contacts 24 and PCB contacts 20 in desired lateral and vertical alignment with one another, and/or to form a dam that prevents contaminants such as uncured adhesive sealant material from reaching the electrical contacts 20, 24. In other words, the contacts 20, 24 may be ring-fenced by the gasket 26 against contamination.

The gasket 26 may include a circumferentially or perimetrically extending side wall 36 that frames and engages the perimeter edge 34 of the package 22 and a lip 38 that extends laterally inward from around a gasket side wall lower edge 40 and is sandwiched between the PCB substrate 18 and a package underside outer marginal portion 42. All or part of the side wall 36 may be slightly circumferentially smaller than the perimeter edge 34 of the package 22 to require that the gasket 26 be stretched to fit around the package 22, thereby ensuring a tight fit and improved seal. The lip 38 may be circumferentially continuous. This lip shape allows the gasket 26 to fit tightly around and under the perimeter edge 34 of the surface-mount electronic package 22 and to rest flat on the PCB substrate 18.

The gasket 26 may comprise any suitable self-supporting or free-standing material such as, an adhesive sealant material. For example, the gasket 26 may comprise a cured polyurethane adhesive sealant such as Uralane®.

In practice, the surface-mount electronic package 22 may be mounted on a PCB substrate 18 by fabricating the gasket 26 in a shape that fits circumferentially around and under the perimeter edge 34 of the surface-mount electronic package 22, then mounting the gasket 26 on the package 22 such that the lip 38 of the gasket 26 extends inwardly under the package 22 and surrounds electrical package (BGA) contacts 24. The gasket 26 and package 22 may then be supported on the PCB substrate 18 such that the gasket lip 38 is sandwiched between the PCB substrate 18 and the outer marginal portion 42 of the bottom surface of the package 22 and such that the package (BGA) contacts 24 are aligned with PCB contacts. Uncured adhesive sealant material 28 may then be applied around the gasket side wall 36 and the perimeter edge 34 of the package 22. The uncured adhesive sealant material 28 may be applied so as to coat the gasket-PCB substrate interface 30 and/or the gasket-package interface 32 to seal the package 22 to the substrate 18.

According to this method, an electronic package can be mounted easily and positioned accurately on a PCB substrate without misalignment of package and PCB contacts. Electrical contacts of the resulting assembly are protected against contamination and damage in the process of sealing the package to the substrate.

This description, rather than describing limitations of an invention, only illustrates an embodiment of the invention recited in the claims. The language of this description is therefore exclusively descriptive and is non-limiting. Obviously, it's possible to modify this invention from what the description teaches. Within the scope of the claims, one may practice the invention other than as described above.

What is claimed is:

1. An electronic package mounting assembly, the assembly comprising:
    a printed circuit board assembly (PCBA) including a printed circuit board (PCB) comprising conductive pathways carried by a non-conductive PCB substrate, and further comprising electrical PCB contacts carried by the PCB substrate and coupled with the conductive pathways;
    an electronic package carried by the PCB and comprising electrical package contacts on a bottom surface of the package, the package contacts being in contact with the PCB contacts;
    a gasket supporting the package on the PCB substrate, surrounding the PCB contacts, fitting around and contacting a laterally outer perimeter edge of the package, and contacting a package underside outer marginal portion, the gasket including a side wall that frames and engages the perimeter edge of the package and a lip that extends inward from around a lower edge of the gasket side wall and is sandwiched between the PCB substrate and the package underside outer marginal portion; and
    a bead of adhesive material surrounding the gasket and coating a lower interface between the gasket and the PCB substrate, the bead of adhesive material coating an upper interface between the gasket and the package.

2. An electronic package mounting assembly as defined in claim 1 in which the lip is circumferentially continuous.

3. A method for mounting an electronic package on a PCB substrate, the method comprising the steps of:
    fabricating a gasket in a shape that fits circumferentially around and under a perimeter edge of an electronic package;
    mounting the gasket on the package such that a side wall of the gasket frames and engages the perimeter edge of the package and a lip of the gasket, which extends inward from around a lower edge of the gasket side wall, extends inwardly under the package and surrounds package contacts;
    disposing the gasket and package on a PCB substrate such that the gasket lip is sandwiched between the PCB substrate and an outer marginal portion of a bottom surface of the package and such that the package contacts are in contact with PCB contacts; and
    applying uncured adhesive sealant material around the gasket side wall and the perimeter edge of the package such that the sealant coats a lower interface between the gasket and the PCB substrate, and also coats an upper interface between the gasket and the package.

4. A product produced by the method of claim 3.

5. The method of claim 3 in which the step of disposing the gasket and package on a PCB substrate includes supporting the gasket on the PCB substrate and supporting the package on the gasket.

* * * * *